United States Patent
Nakagami et al.

(10) Patent No.: US 10,680,537 B2
(45) Date of Patent: Jun. 9, 2020

(54) VIBRATION-TYPE-MOTOR DRIVING APPARATUS

(71) Applicant: CANON KABUSHIKI KAISHA, Tokyo (JP)

(72) Inventors: Hideomi Nakagami, Saitama (JP); Katsuhiko Sato, Utsunomiya (JP); Koji Sato, Utsunomiya (JP); Yasuhiro Hatakeyama, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 723 days.

(21) Appl. No.: 15/428,464

(22) Filed: Feb. 9, 2017

(65) Prior Publication Data

US 2017/0237367 A1  Aug. 17, 2017

(30) Foreign Application Priority Data

Feb. 16, 2016 (JP) ................. 2016-026552

(51) Int. Cl.
| | |
|---|---|
| *B06B 1/06* | (2006.01) |
| *G02B 7/10* | (2006.01) |
| *H01L 41/09* | (2006.01) |
| *H02N 2/10* | (2006.01) |

(52) U.S. Cl.
CPC ............. *H02N 2/103* (2013.01); *B06B 1/06* (2013.01); *B06B 1/0688* (2013.01); *G02B 7/10* (2013.01); *H01L 41/09* (2013.01)

(58) Field of Classification Search
CPC ........ H02N 2/103; H01L 41/09; B06B 1/0688
See application file for complete search history.

(56) References Cited

U.S. PATENT DOCUMENTS

| | | | | |
|---|---|---|---|---|
| 5,726,515 A | * | 3/1998 | Tsukimoto | ............. H02N 2/106 310/323.12 |
| 9,677,555 B2 | * | 6/2017 | Kamen | ............... G06F 19/3418 |
| 2017/0237367 A1 | * | 8/2017 | Nakagami | ............. B06B 1/0688 310/328 |

FOREIGN PATENT DOCUMENTS

| | | |
|---|---|---|
| JP | 03018280 A | 1/1991 |
| JP | 05015174 A | 1/1993 |
| JP | 06046579 A | 2/1994 |
| JP | 2511194 Y2 | 9/1996 |
| JP | 2006180589 A | 7/2006 |

* cited by examiner

*Primary Examiner* — Thomas M Dougherty
*Assistant Examiner* — Karen B Addison
(74) *Attorney, Agent, or Firm* — Rossi, Kimms & McDowell LLP

(57) ABSTRACT

The vibration-type-motor driving apparatus includes a vibration-type motor including a vibrator on which vibration is excited by an electro-mechanical energy conversion element, a shaft that supports the vibrator, and a rotor that contacts the vibrator to be rotated thereby. A first end portion of the shaft is moved with the vibration of the vibrator. The apparatus further includes a housing that houses therein the motor, and a first elastic member that contacts the first end portion of the shaft and is deformable in a direction in which the first end portion vibrates. The first elastic member transfers heat of the shaft to the housing or another member provided inside the housing.

10 Claims, 8 Drawing Sheets

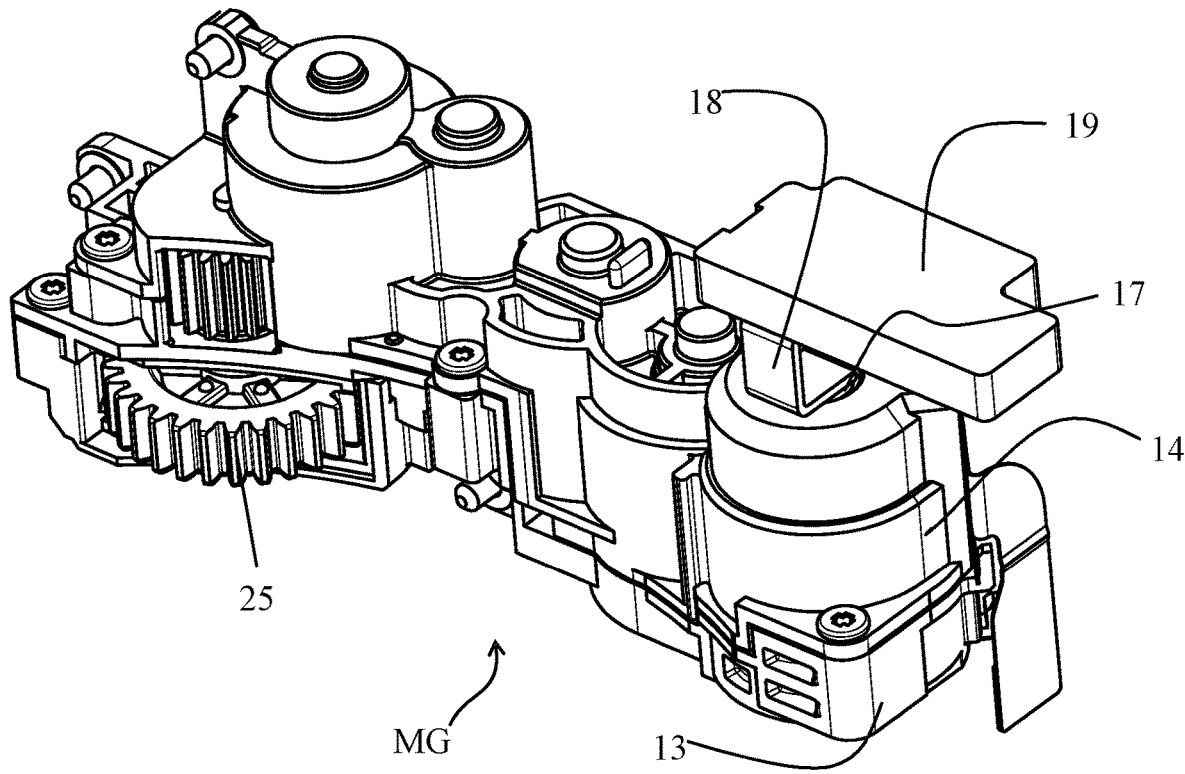
FIG. 4
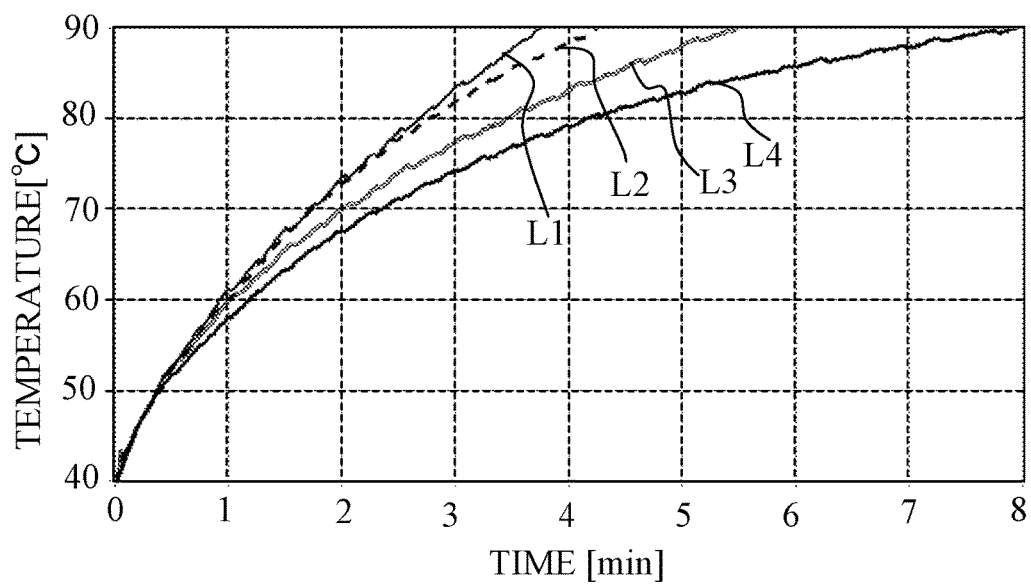
FIG. 5 (L1 - Prior Art)

VIBRATION-TYPE-MOTOR DRIVING APPARATUS

BACKGROUND OF THE INVENTION

Field of the Invention

The present invention relates to a driving apparatus including a vibration-type motor as a driving source.

Description of the Related Art

Vibration-type motors each include a vibrator (elastic body) on which vibration is excited by an electro-mechanical energy conversion element (piezo element) and a rotor that contacts the vibrator to be rotated thereby. In such vibration-type motors, heat is generated due to abrasion between the vibrator and the rotor, which varies a drive characteristic of the motor.

Japanese Patent Laid-Open No. 05-015174 disclosed a ring vibration-type motor including a heat radiating member that is disposed between the piezo element and a housing of the motor and contact them in order to radiate the heat generated by the abrasion.

On the other hand, the vibration-type motors include a so-called stick-shaped vibration-type motor as disclosed in Japanese Patent Laid-Open No. 2006-180589. In such a stick-shaped vibration-type motor, a bending vibration generated sequentially in the vibrator and a shaft supporting the vibrator causes a circular motion of the vibrator and an end portion of the shaft. Therefore, using in the stick-shaped vibration-type motor the radiation member used for the ring-shaped vibration-type motor disclosed in Japanese Patent Laid-Open No. 05-015174 without change inhibits the circular motion of the end portion of the shaft, which influences a drive characteristic of the stick-shaped vibration-type motor.

SUMMARY OF THE INVENTION

The present invention provides a vibration-type motor capable of radiating heat generated therein without influencing a drive characteristic thereof.

The present invention provides a vibration-type-motor driving apparatus capable of efficiently radiating heat generated in a vibration-type motor without influencing a drive characteristic of the motor.

The present invention provides as an aspect thereof a vibration-type-motor driving apparatus including a vibration-type motor including a vibrator on which vibration is excited by an electro-mechanical energy conversion element, a shaft that supports the vibrator, and a rotor that contacts the vibrator to be rotated thereby, a first end portion of the shaft being moved with the vibration of the vibrator, a housing that houses therein the motor, and a first elastic member that contacts the first end portion of the shaft and is deformable in a direction in which the first end portion vibrates, the first elastic member transferring heat of the shaft to the housing or another member provided inside the housing.

Further features and aspects of the present invention will become apparent from the following description of exemplary embodiments with reference to the attached drawings.

BRIEF DESCRIPTION OF THE DRAWINGS

FIG. 4 is an oblique perspective view of the motor gear unit in Embodiment 1.

FIG. 5 is graphs illustrating temperature changes of the vibration-type motor of Embodiments 1 (and 2), a conventional vibration-type motor and a vibration-type motor as a comparative example.

DESCRIPTION OF THE EMBODIMENTS

Exemplary embodiments of the present invention will be described below with reference to the accompanied drawings.

Embodiment 1

Figure 1:
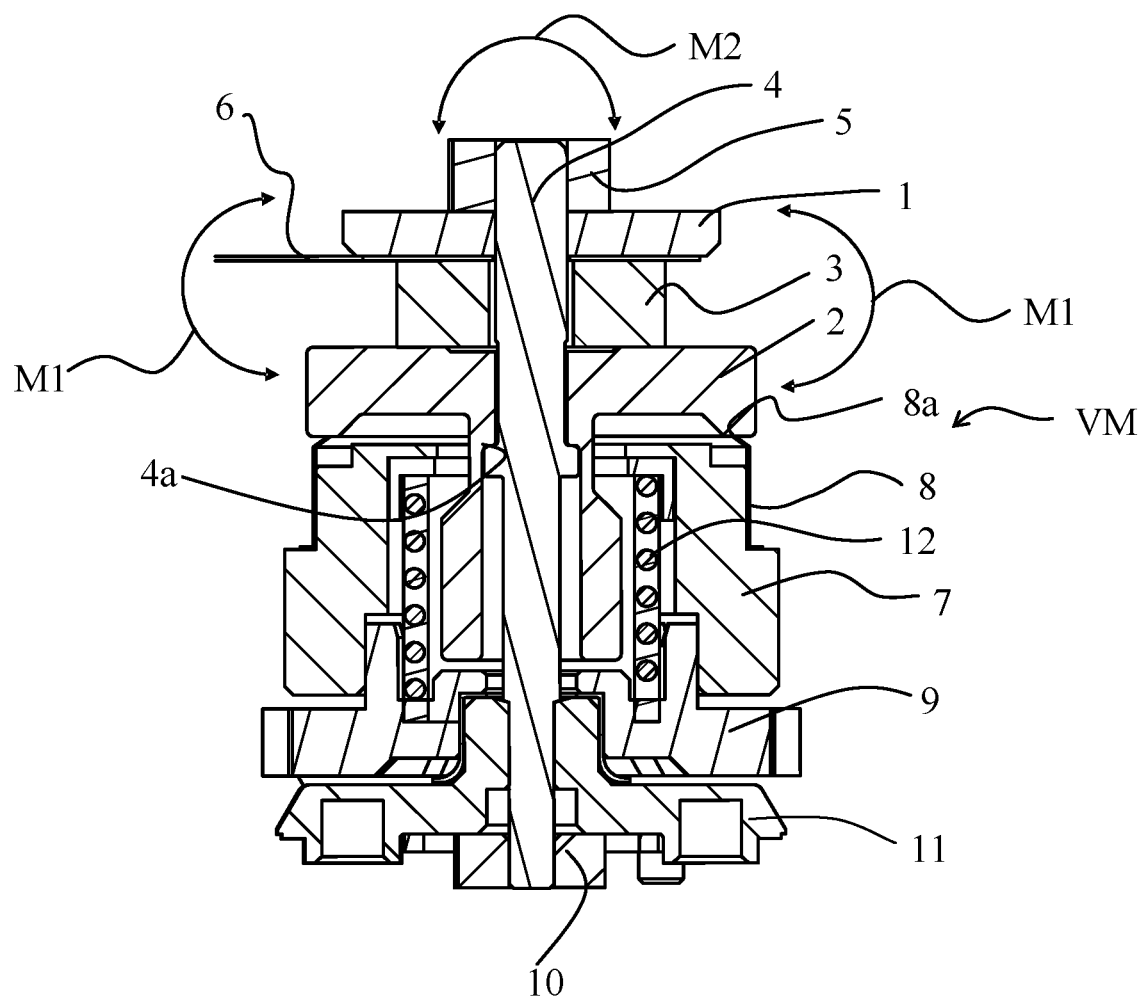
FIG. 1 is a sectional view of a vibration-type motor used in a vibration-type-motor driving apparatus (lens driving adapter) that is Embodiment 1 of the present invention.

FIG. 1 illustrates a section of a stick-shaped vibration-type motor VM used in a vibration-type-motor driving apparatus that is a first embodiment (Embodiment 1) of the present invention. The vibration-type motor VM in FIG. 1 is cut along a center axis of a shaft described later.

The vibration-type motor VM includes a first elastic body 1, a second elastic body 2 formed of a metal material and a laminated piezo element (electro-mechanical energy conversion element) 3 disposed between the first and second elastic bodies 1 and 2.

The first and second elastic bodies 1 and 2 and the laminated piezo element 3 are provided with hole portions through which a shaft 4 penetrates. On an outer circumference of an end portion (first end portion) of the shaft 4 in its axis direction, a first nut 5 is assembled. The laminated piezo element 3 is connected with a flexible printed wiring board 6 for applying, to the laminated piezo element 3, two phase periodic voltage signals whose phases are mutually different. The first and second elastic bodies 1 and 2 and the laminated piezo element 3 (flexible printed wiring board 6) are sandwiched and held between a thrust position stopper 4a provided at an axis-direction middle position of the shaft 4 and the first nut 5, which constitute a vibrator.

The vibration-type motor VM further includes a rotor body 7, a contact member 8 bonded to a vibrator-side end portion of the rotor body 7 to fixed thereto and a motor gear 9 integrally rotatably connected to an opposite-to-vibrator side end portion of the rotor body 7. The contact member 8 is formed by press-forming of a stainless plate and has in its peripheral edge portion a frictional contact portion 8a. These rotor body 7, contact portion 8 and motor gear 9 constitute a rotor.

The rotor is prevented from moving in the axis direction by a flange 11 fixed by a second nut 10 to another end portion (second end portion) of the shaft 4.

A compressed coil spring 12 being charged is disposed between the rotor body 7 and the motor gear 9. The compressed coil spring 12 generates a biasing force (elastic force), which causes the frictional contact portion 8a of the contact member 8 to make a press contact with the second elastic body 2.

The laminated piezo element 3 has two groups of electrodes. The above-described two phase periodic voltage signals (for example, pulse signals) are applied to the two electrode groups through the flexible printed wiring board 6. Applying the two phase periodic voltage signals to the two electrode groups excites, to the vibrator and the shaft 4, two bending vibrations, that is, a bending vibration M1 in a first direction parallel to a sheet of FIG. 1 and another bending vibration (not illustrated) in a second direction orthogonal to the first direction (direction perpendicular to the sheet of FIG. 1). Adjusting the phases of the periodic voltage signals enables providing a 90-degree temporal phase difference to the two bending vibrations. As a result, a direction of the bending vibration of the vibrator sequentially changes to four directions (that is, rotates) about a central axis of the shaft 4. Thereby, on a contact surface of the second elastic body 2 contacting the frictional contact portion 8a of the contact member 8, an elliptic motion is generated. This elliptic motion rotationally drives, via the frictional contact portion 8a, the contact member 8 and further the entire rotor about the shaft 4.

Figure 2:
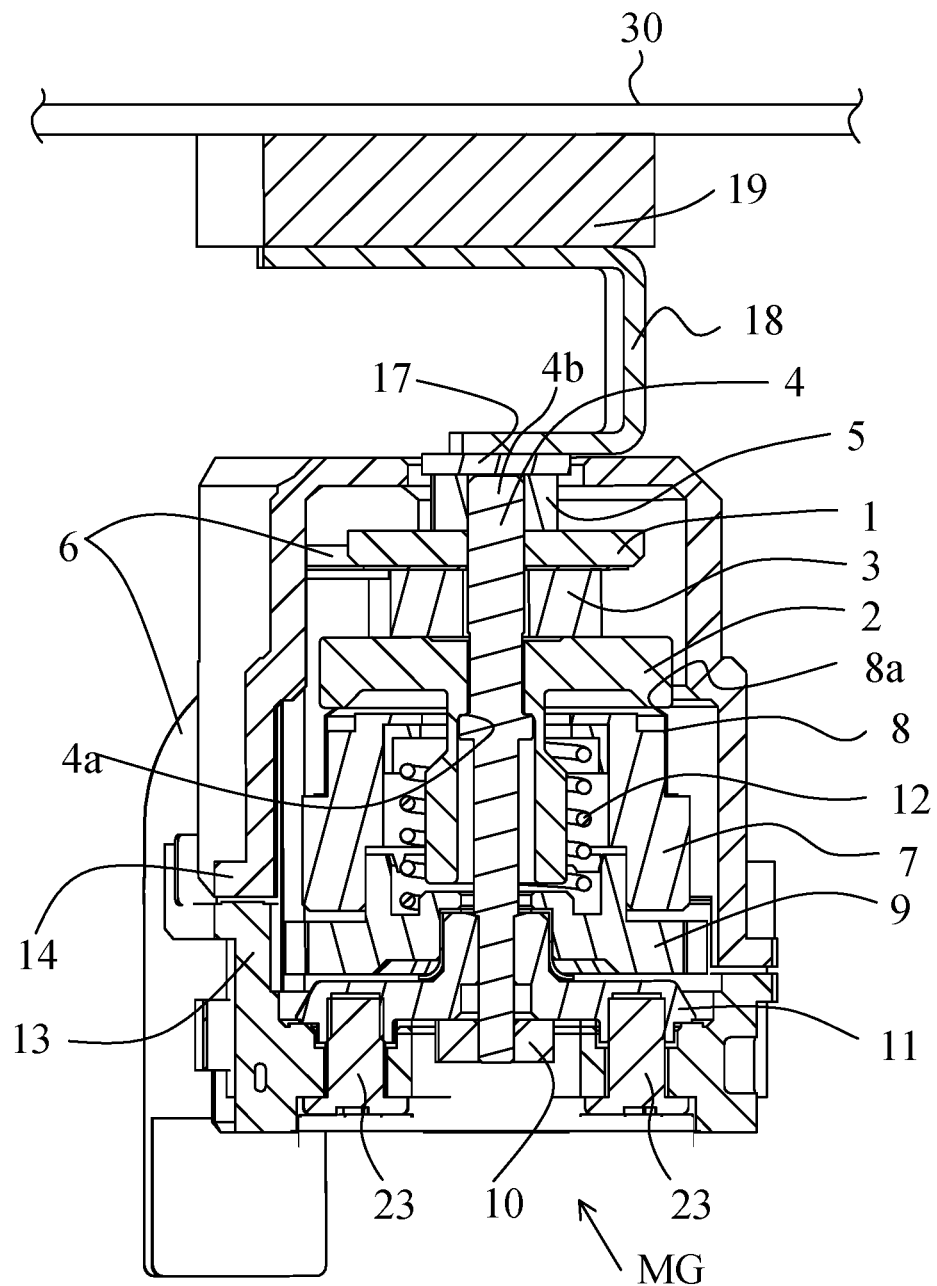
FIG. 2 is a sectional view of a motor gear unit in the lens driving adapter of Embodiment 1.
Figure 3:
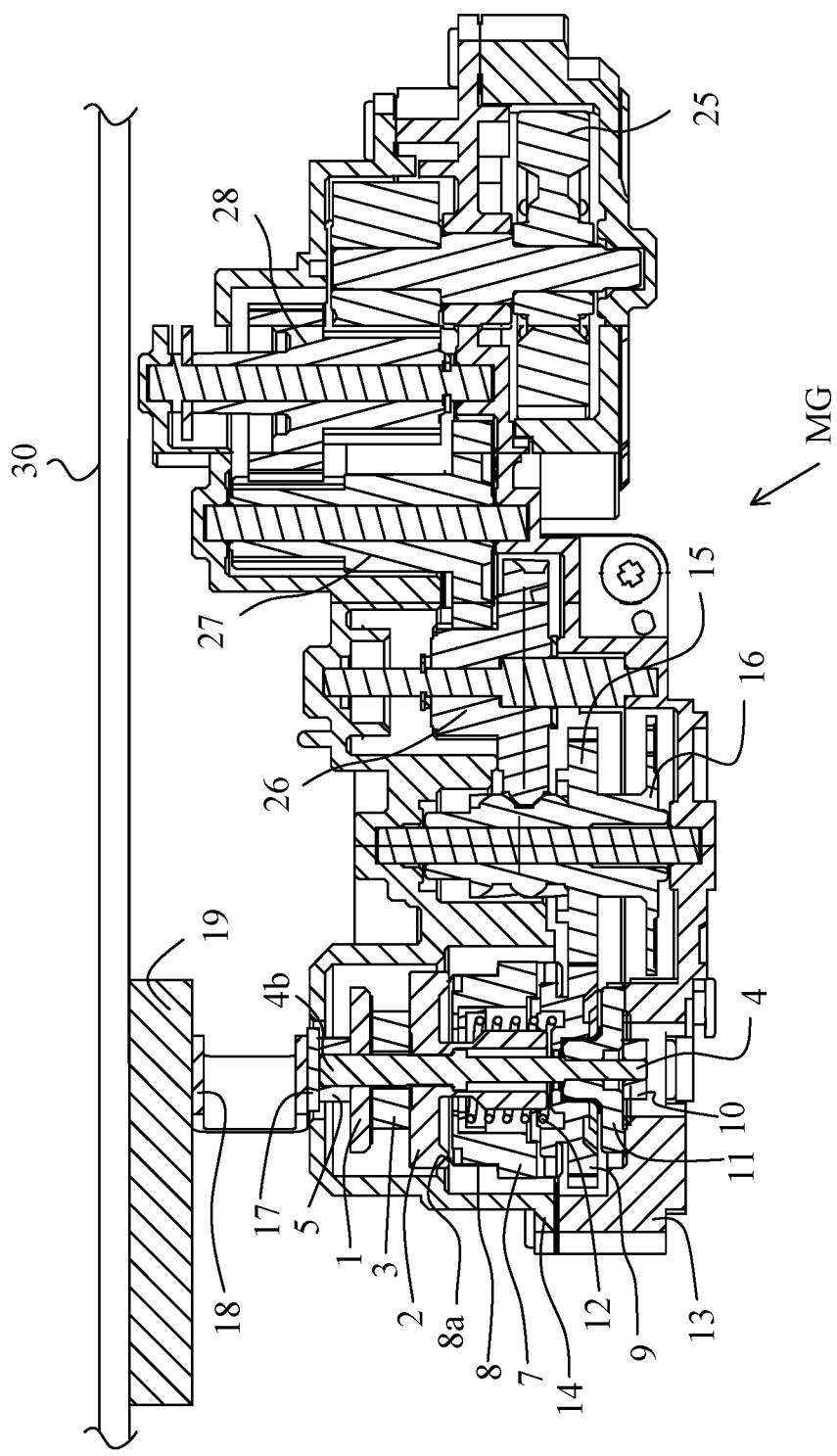
FIG. 3 is another sectional view of the motor gear unit in Embodiment 1.

The vibration-type motor VM thus constituted is installed in a motor gear unit MG illustrated in FIGS. 2 to 4.

FIG. 2 illustrates a section of the motor gear unit MG.

FIG. 3 illustrates another section of the motor gear unit MG, and FIG. 4 illustrates an exterior of the motor gear unit MG.

The vibration-type motor VM is housed inside a first gear box 13 and a second gear box 14 constituting a housing of the motor gear unit MG. The flange 11 is fixed to the first gear box 13 with screws 23.

Thus, the vibration-type motor VM is cantilever-held such that its flange (11) side part is a fixed end and its first nut (5) side part is a free end. Thereby, the above-described two excited bending vibrations cause the first nut (5) side part to circularly move with respect to the flange (11) side part as a supporting point. For example, when the bending vibration M1 illustrated in FIG. 1 is excited on the vibrator, the first nut (5) side part is moved in a M2 direction that is a right-and-left direction illustrated in FIG. 1. In the following direction, the direction in which the first nut (5) side part circularly moves is simply referred to as "a first-nut-side movement direction".

Figure 10:
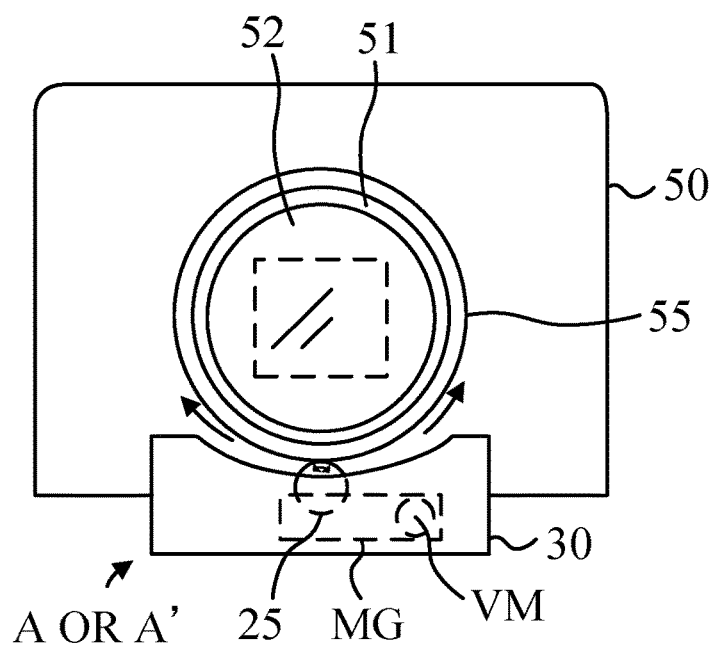
FIG. 10 illustrates a lens driving adapter using the motor gear unit in Embodiment 1 or 2.

The motor gear 9 of the vibration-type motor VM meshes with an output-extracting gear 15 rotatably held by the first and second gear boxes 13 and 14 to rotate the output-extracting gear 15. The output-extracting gear 15 is provided integrally with a pulse plate 16. Using the pulse plate 16 and a photo interrupter (not illustrated) enables detecting a rotation amount of the output-extracting gear 15, that is, of the vibration-type motor VM. The rotation of the output-extracting gear 15 is transmitted to a drive gear 25 as a driven member via idler gears 26, 27 and 28 to drive the drive gear 25. The driven member is a member driven by a driving force from the vibration-type motor VM. The motor gear unit MG thus configured is held inside a housing (casing) 30 of a lens driving adapter A as the vibration-type-motor driving apparatus illustrated in FIG. 10 by screw-fixing the first and second gear boxes 13 and 14 to the housing 30.

The lens driving adapter A is detachably attachable to a lens barrel 51 of an interchangeable lens 52 as an optical apparatus that is attachable to a camera 50. Around an outer circumference of the lens barrel 51, a manual ring 55 as an operation member that is manually operated by a user for zooming or focusing is provided. The drive gear 25 of the lens driving adapter A attached to the interchangeable lens 52 meshes with a gear portion formed in a part of an outer circumference of the manual ring 55. Thereby, the rotational driving force from the vibration-type motor VM is transmitted to the manual ring 55 via the drive gear 25 to rotationally drive the manual ring 55. Thus, power zooming or power focusing is performed.

In FIGS. 1 to 3, when the rotor is rotated, the contact member 8 (frictional contact portion 8a) and the second elastic body 2 slide with respect to each other, which generates frictional heat at their sliding surfaces. Furthermore, the contact member 8 and the second elastic body 2 are both formed of metal, so that the generated frictional heat is increased by the slide of these metal members. The generated frictional heat increases a temperature of the sliding surfaces and is transferred to the laminated piezo element 3, which changes (deteriorates) a drive characteristic of the vibration-type motor VM. Specifically, even though two phase periodic voltage signals equal to those before the temperature increase are applied to the vibration-type motor VM, a generated torque and a rotation frequency are changed, and therefore the drive characteristic of the vibration-type motor VM cannot be stably maintained.

Thus, as illustrated in FIGS. 2 and 3, this embodiment provides a deformable heat transfer member as a first elastic member that contacts one end portion (one end face) 4b of the shaft 4 and the first nut 5. A surface of the deformable heat transfer member 17 opposite to the one end portion 4b of the shaft 4 contacts an intermediate heat transfer member as a third elastic member. The intermediate heat transfer member 18 contacts a heat storage transfer member 19 as a second elastic member. The heat storage transfer member 19, which corresponds to another member inside the housing 30, has a heat capacity larger than those of the deformable and intermediate heat transfer members 17 and 18 and has not only a heat transfer function but also a heat storage function. The heat storage transfer member 19 is formed of metal such as iron copper or aluminum. The heat storage transfer member 19 contacts the housing 30 of the lens driving adapter A.

Such a heat radiation structure enables transferring the frictional heat generated at the sliding surfaces in the vibration-type motor VM through the shaft 4 that passes through a center of the vibration-type motor VM and is disposed near the sliding surfaces and the laminated piezo element 3, via the deformable heat transfer member 17 and the intermediate heat transfer member 18, to the heat storage transfer member 19. Then, the heat is transferred to the housing 30 of the lens driving adapter A while being stored in the heat storage transfer member 19 to some extent and is radiated from an outer surface of the housing 30.

The deformable heat transfer member 17 is easily deformable (that is, has a low rigidity) in the first-nut-side movement direction when the vibration-type motor VM is driven. Specifically, the deformable heat transfer member 17 has a lower rigidity than those of the intermediate heat transfer member 18 and the heat storage transfer member 19. The deformable heat transfer member 17 is formed using a gel(-like) material such as silicon or acrylic. Providing this deformable heat transfer member 17 contacting the one end portion 4b of the shaft 4 and the first nut 5 enables efficiently radiating the frictional heat generated at the sliding surfaces in the vibration-type motor VM without interfering with the bending vibration of the vibrator and the shaft 4 in the vibration-type motor VM.

Figure 6:
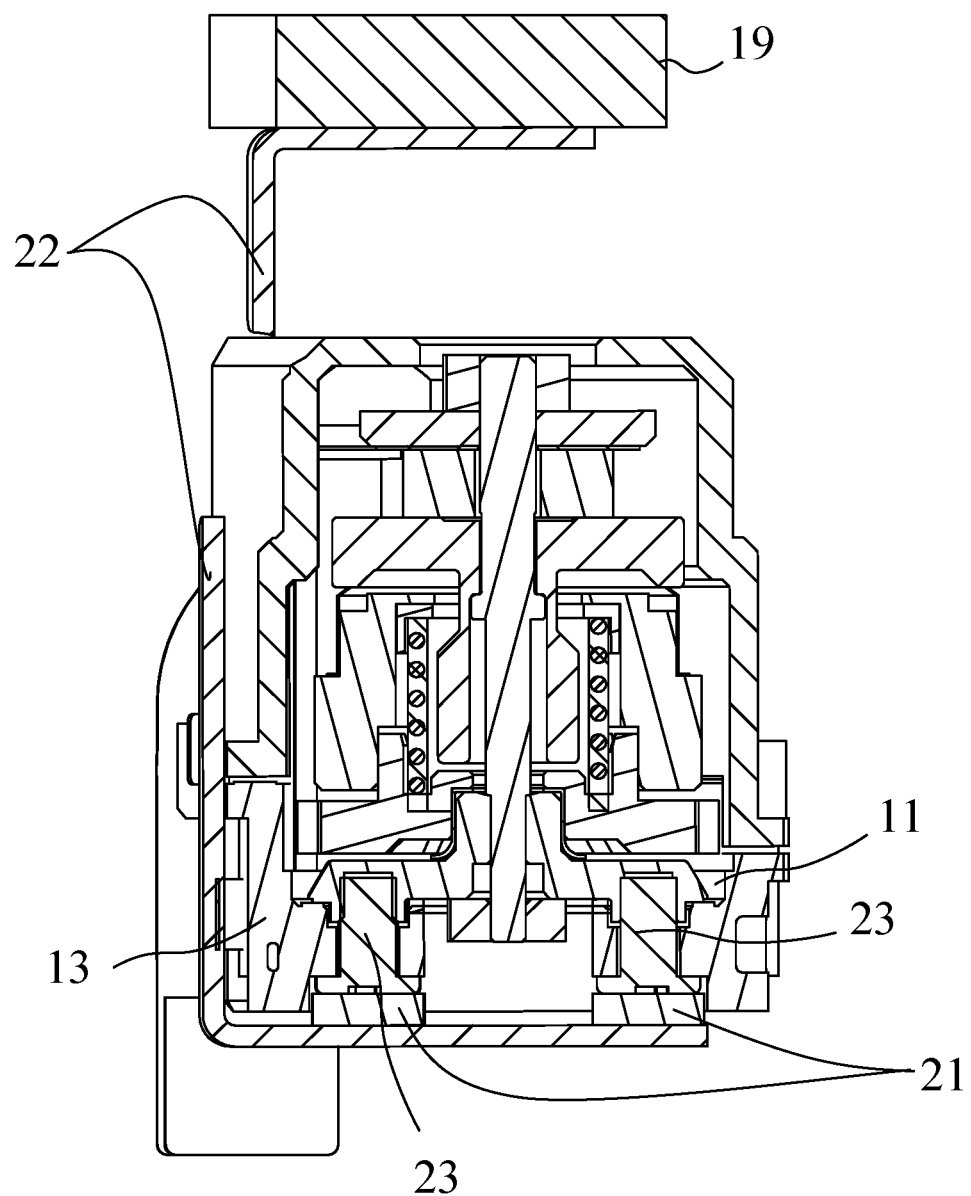
FIG. 6 is a sectional view of a motor gear unit as a comparative example.

FIG. 5 illustrates experimental data showing a temperature change (increase) of the vibration-type motor VM illustrated in FIG. 1 when the vibration-type motor VM was continuously driven. Although the temperature of the vibration-type motor VM in FIG. 5 was measured at the first elastic body 1, it may be measured at other members. FIG. 6 illustrates a motor gear unit of a vibration-type motor as a comparative example with respect to the motor gear unit MG in this embodiment illustrated in FIGS. 2 to 4. The comparative example has a configuration in which the deformable heat transfer member 17 and the intermediate heat transfer member 18 are removed from the motor gear unit MG in this embodiment. Furthermore, in the comparative example, deformable heat transfer members formed of the same material as that of the deformable heat transfer member 17 contact the screws 23 fixing the flange 11 to the first gear box 13, and an intermediate heat transfer member 22 contacts the deformable heat transfer members 21. The intermediate heat transfer member 22 further contacts the heat storage transfer member 19. In FIG. 5, a graph L1 shows a temperature change of a conventional vibration-type motor in which the deformable heat transfer member 17, the intermediate heat transfer member 18 and the deformable heat transfer member 19 are all not provided. A graph L2 shows a temperature change of the vibration-type motor of the comparative example illustrated in FIG. 6. A graph L3 shows the temperature change of the vibration-type motor MV in this embodiment in which the deformable heat transfer member 17, the intermediate heat transfer member 18 and the deformable heat transfer member 19 are all provided.

As clear from FIG. 5, the temperature increase (L3) of the vibration-type motor MV of this embodiment is sufficiently reduced as compared with the temperature increase (L1) of the conventional vibration-type motor and the temperature increase (L2) of the comparative example.

Embodiment 2

Figure 7:
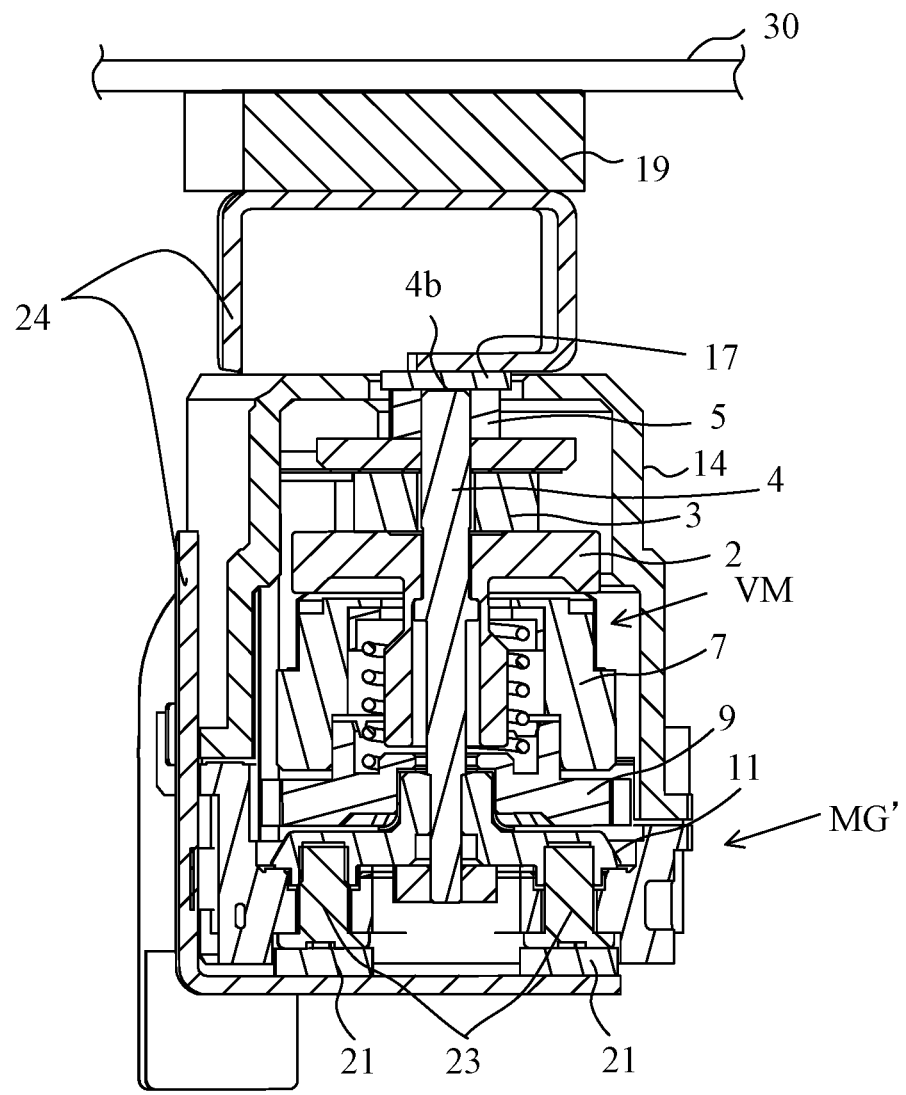
FIG. 7 is a partial sectional view of a motor gear unit in a vibration-type motor in Embodiment 2 of the present invention.
Figure 8:
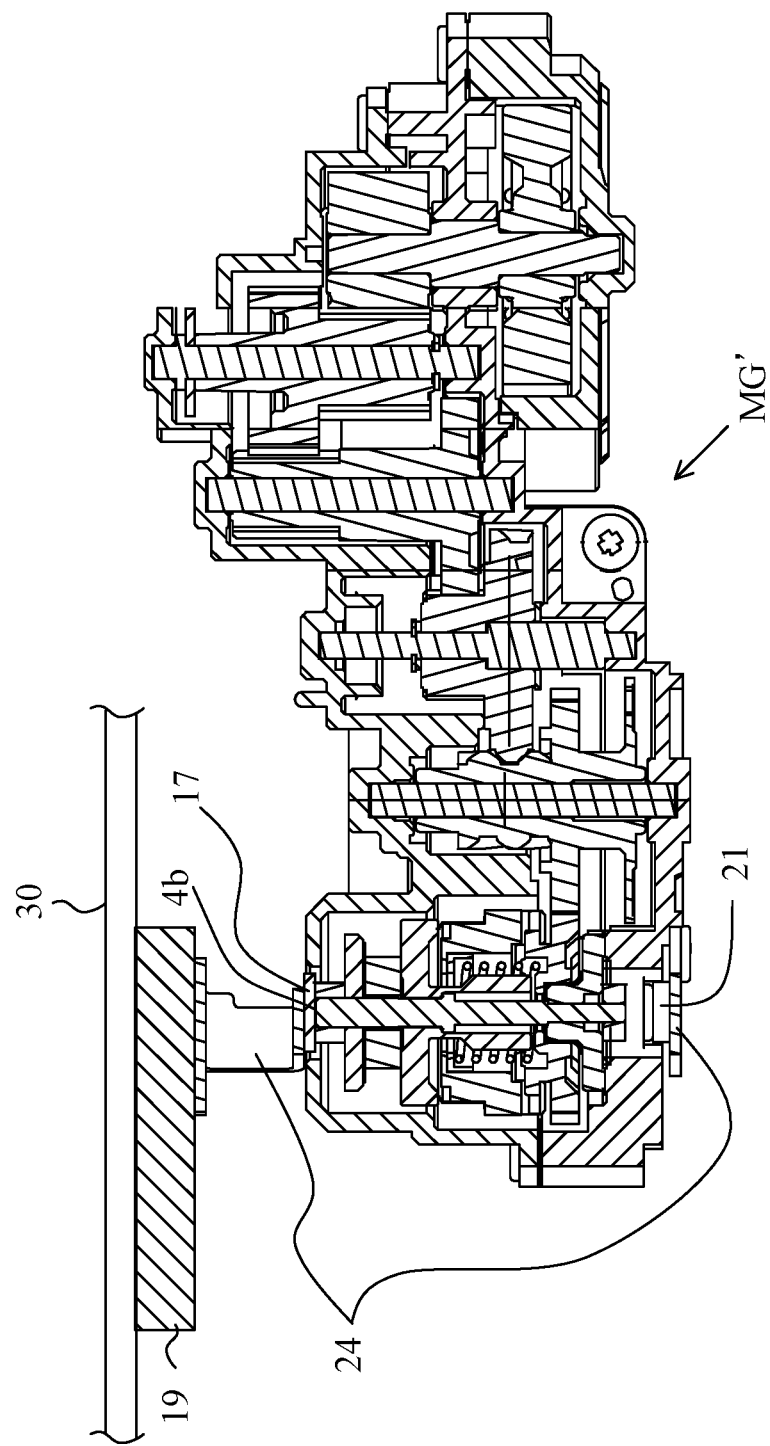
FIG. 8 is a sectional view of the motor gear unit in Embodiment 2.
Figure 9:
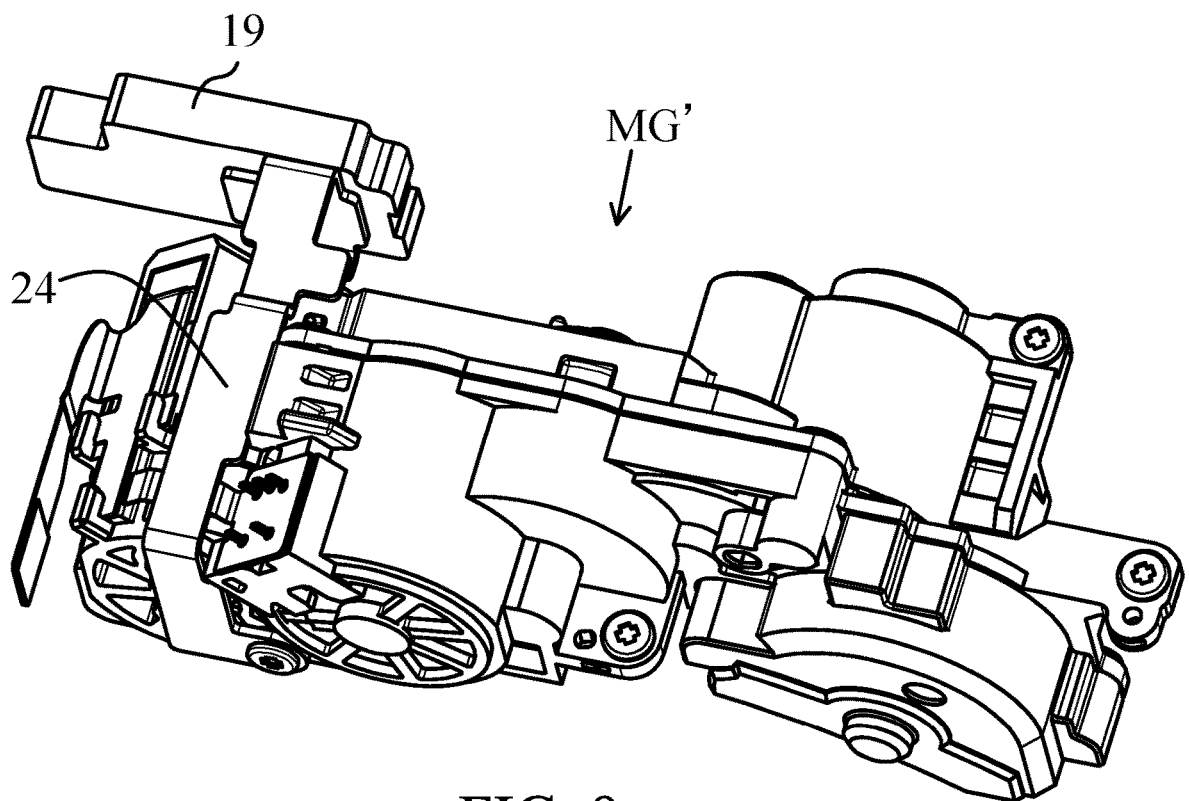
FIG. 9 is a perspective view of the motor gear unit in Embodiment 2.

FIG. 7 illustrates a section of a motor gear unit MG' in a vibration-type-motor driving apparatus (a lens driving adapter A' illustrated in FIG. 10) that is a second embodiment (Embodiment 2) of the present invention. The apparatus in FIG. 7 is cut along a center axis of a shaft 4. In this embodiment, constituent elements common to those in Embodiment 1 are denoted by the same reference numerals as those in Embodiment 2. FIG. 8 illustrates another section of the motor gear unit MG', and FIG. 9 illustrates an exterior of the motor gear unit MG'.

In this embodiment, in addition to the deformable heat transfer member 17 and the heat storage transfer member 19 described in Embodiment 1, the deformable heat transfer members 21 illustrated in FIG. and an intermediate heat transfer member 24 as a third elastic member as an alternative to the intermediate heat transfer member 18 described in Embodiment 1 are provided. The deformable heat transfer members 21 as fourth elastic members are formed of the same material as that of the deformable heat transfer member 17 and contact screws 23 as fixing members for fixing a flange 11 to a first gear box 13 as a supporting member. The intermediate heat transfer member 24 contacts the deformable heat transfer members 21. The intermediate heat transfer member 24 extends from a flange (11) side to a first nut (5) side in a vibration-type motor VM to also contact the deformable heat transfer member 17 and further extends to and contacts the heat storage transfer member 19.

In FIG. 5, a graph L4 shows a temperature change of the vibration-type motor VM in this embodiment.

Although Embodiment 1 transmits the heat only from the first nut (5) side to the heat storage transfer member 19 and the housing 30, this embodiment transmits the heat not only from the first nut (5) side but also from a screw (23) side to the heat storage transfer member 19 and the housing 30. Thereby, this embodiment can effectively reduce the temperature increase of the vibration-type motor VM as compared with Embodiment 1 (L3).

Although the above embodiments described the case where the deformable heat transfer member 17 contacts both the one end portion 4b of the shaft 4 and the first nut 5, the deformable heat transfer member 17 may contact only the one end portion 4b of the shaft 4.

Furthermore, the above embodiments described the case where the intermediate heat transfer member 18 or 24 is provided between the deformable heat transfer member 17 and the heat storage transfer member 19. Providing the intermediate heat transfer member 18 or enables, even when there is a large space between the vibration-type motor VM and the housing 30, the heat storage transfer member 19 to contact the housing and enables effectively transferring the heat generated in the vibration-type motor VM to the heat storage transfer member 19.

Moreover, although the above embodiments described the case where the vibration-type motor VM is used as a driving source of the lens driving adapter A or A' that is attachable to the lens barrel, the heat radiation structures described in the above embodiments may be used in various vibration-type-motor driving apparatuses other than the lens driving adapter.

In addition, in the above embodiments, as illustrated in FIG. 2 and others, the deformable heat transfer member 17 is desirable to be a thinner member than the heat storage transfer member 19. This is because such a deformable heat transfer member 17 makes it easy to transfer the heat to the intermediate heat transfer member 18 or 24.

As described above, each of the embodiments provides, at the first end portion of the shaft that is moved with the vibration of the vibrator, the first elastic member deformable in the movement direction of the first end portion and radiates the heat generated in the vibration-type motor through the first elastic member. This heat radiation structure enables effectively radiating the heat generated in the vibration-type motor without influencing the drive characteristic of the vibration-type motor.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™, a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-026552, filed on Feb. 16, 2016, which is hereby incorporated by reference herein in its entirety.

What is claimed is:

1. A driving apparatus comprising:
a vibration-type motor including a vibrator on which vibration is excited by an electro-mechanical energy conversion element, a shaft that supports the vibrator, and a rotor that contacts the vibrator to be rotated thereby, a first end portion of the shaft being moved with the vibration of the vibrator;
a housing that houses therein the vibration-type motor; and
a first elastic member that contacts the first end portion of the shaft and is deformable in a direction in which the first end portion vibrates, the first elastic member transferring heat of the shaft to the housing or another member provided inside the housing.

2. The driving apparatus according to claim 1, wherein the first elastic member is formed using a gel material.

3. The driving apparatus according to claim 2, wherein the another member includes a second elastic member having a heat capacity larger than that of the first elastic member and transferring heat to the housing.

4. The driving apparatus according to claim 3, wherein the first elastic member has a thickness smaller than that of the second elastic member.

5. The driving apparatus according to claim 3, further comprising a third elastic member that is between the first and second elastic members and transfers heat from the first elastic member to the second elastic member.

6. The driving apparatus according to claim 5, further comprising:
a supporting member that supports the vibration-type motor; and
a fixing member for fixing the vibration-type motor to the supporting member,
wherein the third elastic member contacts the fixing member on a side of a second end portion of the shaft opposite to the first end portion.

7. The driving apparatus according to claim 6, further comprising a fourth elastic member being between the fixing member and the third elastic member and formed using a material identical to that of the first elastic member.

8. The driving apparatus according to claim 1, wherein in the vibration-type motor the first end portion of the shaft is circularly moved, with bending vibration of the vibrator.

9. The driving apparatus according to claim 1, further comprising a driven member that is driven using a driving force from the rotor.

10. The driving apparatus according to claim 9, wherein the apparatus is detachably attachable to an optical apparatus and drives, via the driven member, a manually-operable operation member in the optical apparatus.

* * * * *